US012719013B2

(12) United States Patent
Kadowaki et al.

(10) Patent No.: US 12,719,013 B2
(45) Date of Patent: Aug. 25, 2026

(54) CHARGED PARTICLE BEAM APPARATUS

(71) Applicant: Hitachi High-Tech Corporation, Tokyo (JP)

(72) Inventors: Tetsuro Kadowaki, Tokyo (JP); Takeyoshi Ohashi, Tokyo (JP); Takuma Yamamoto, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 766 days.

(21) Appl. No.: 18/142,119

(22) Filed: May 2, 2023

(65) Prior Publication Data

US 2023/0411111 A1 Dec. 21, 2023

(30) Foreign Application Priority Data

May 26, 2022 (JP) ................................ 2022-086108

(51) Int. Cl.
*H01J 37/21* (2006.01)
*H01J 37/147* (2006.01)
*H01J 37/28* (2006.01)

(52) U.S. Cl.
CPC .......... *H01J 37/21* (2013.01); *H01J 37/1478* (2013.01); *H01J 37/28* (2013.01); *H01J 2237/216* (2013.01); *H01J 2237/24578* (2013.01); *H01J 2237/24585* (2013.01)

(58) Field of Classification Search
None
See application file for complete search history.

(56) References Cited

U.S. PATENT DOCUMENTS 7,154,090 B2 12/2006 Kawada et al.
9,324,540 B2 4/2016 Tachibana et al.
2009/0114817 A1* 5/2009 Bullock ............ G01R 31/2831 250/311

FOREIGN PATENT DOCUMENTS

JP 3542478 B 7/2004
JP 2005327578 A * 11/2005 ........... G01N 23/225
JP 2014143031 A * 8/2014
JP 2014146526 A * 8/2014
JP 5851352 B2 2/2015
JP 2021-82595 A 5/2021
KR 101038139 B1 * 5/2011 ............ H01J 37/244

* cited by examiner

*Primary Examiner* — Andrew Smyth
(74) *Attorney, Agent, or Firm* — Crowell & Moring LLP

(57) ABSTRACT

The present disclosure makes it possible to shorten the time required for measurement of a sample and to measure the sample with high throughput. A charged particle beam apparatus includes a storage device that stores a correction value table corresponding to a recipe and a computer system that executes measurement on a plurality of measurement points of a sample according to a measurement order determined in the recipe. The computer system stores, when executing the recipe on a first sample, an adjustment result of one or more imaging conditions in the correction value table at each of a plurality of measurement points of the first sample, and adjusts, when executing the recipe on a second sample different from the first sample, the imaging condition based on the adjustment result of the one or more imaging conditions stored in the correction value table at each of the plurality of measurement points.

15 Claims, 19 Drawing Sheets

[FIG. 1]
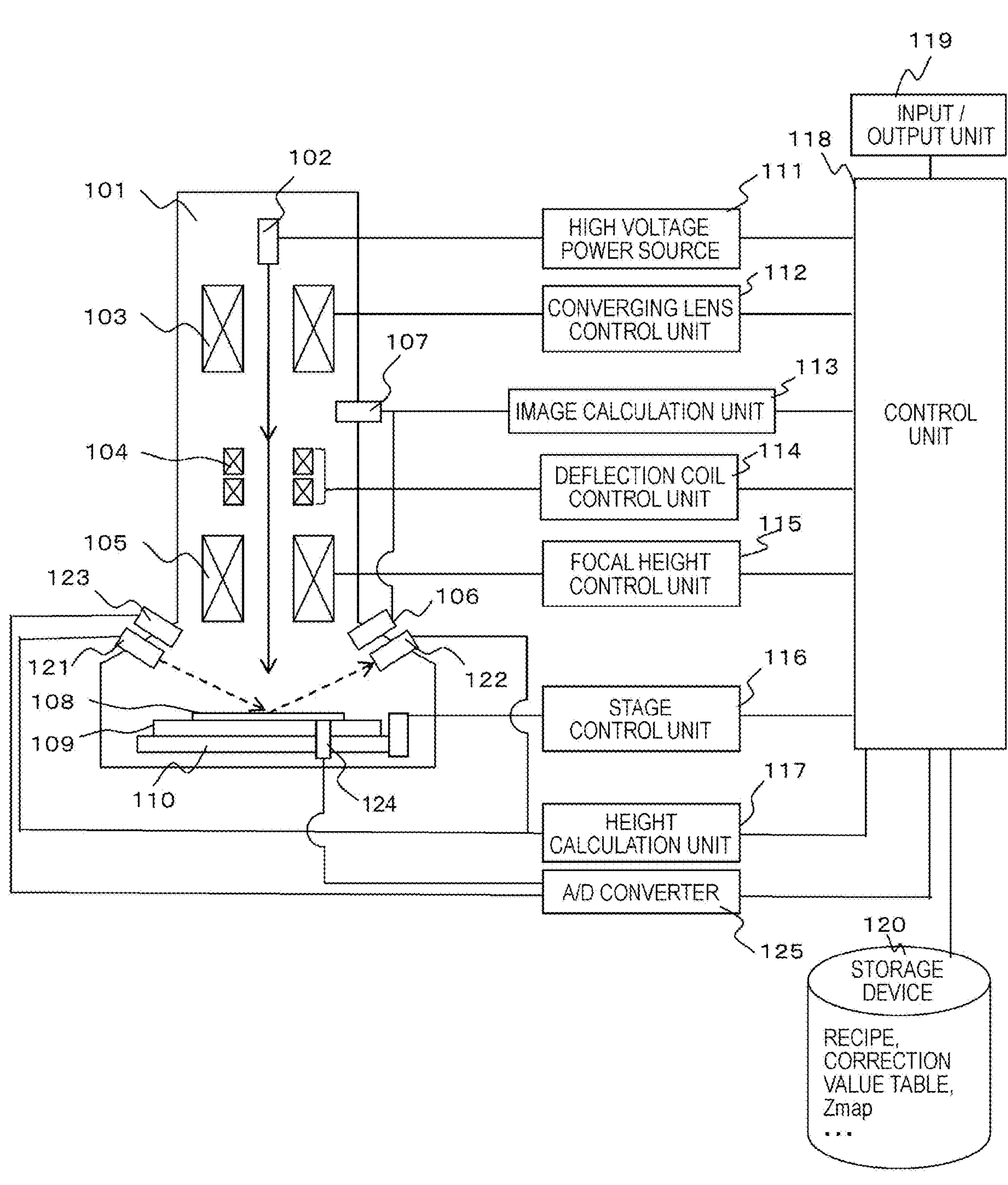

[FIG. 2]

| MEASUREMENT ORDER | COORDINATES | CORRECTION VALUE | ELAPSED TIME | WAFER TEMPERATURE |
|---|---|---|---|---|
| 1 | (X(1), Y(1) ) | ΔOBJ (1) | ΔT (1) | W (1) |
| 2 | (X(2), Y(2) ) | ΔOBJ (2) | ΔT (2) | W (2) |
| 3 | (X(3), Y(3) ) | ΔOBJ (3) | ΔT (3) | W (3) |
| . | . | . | . | . |
| . | . | . | . | . |
| n | (X(n), Y(n) ) | ΔOBJ (n) | ΔT (n) | W (n) |

[FIG. 3]
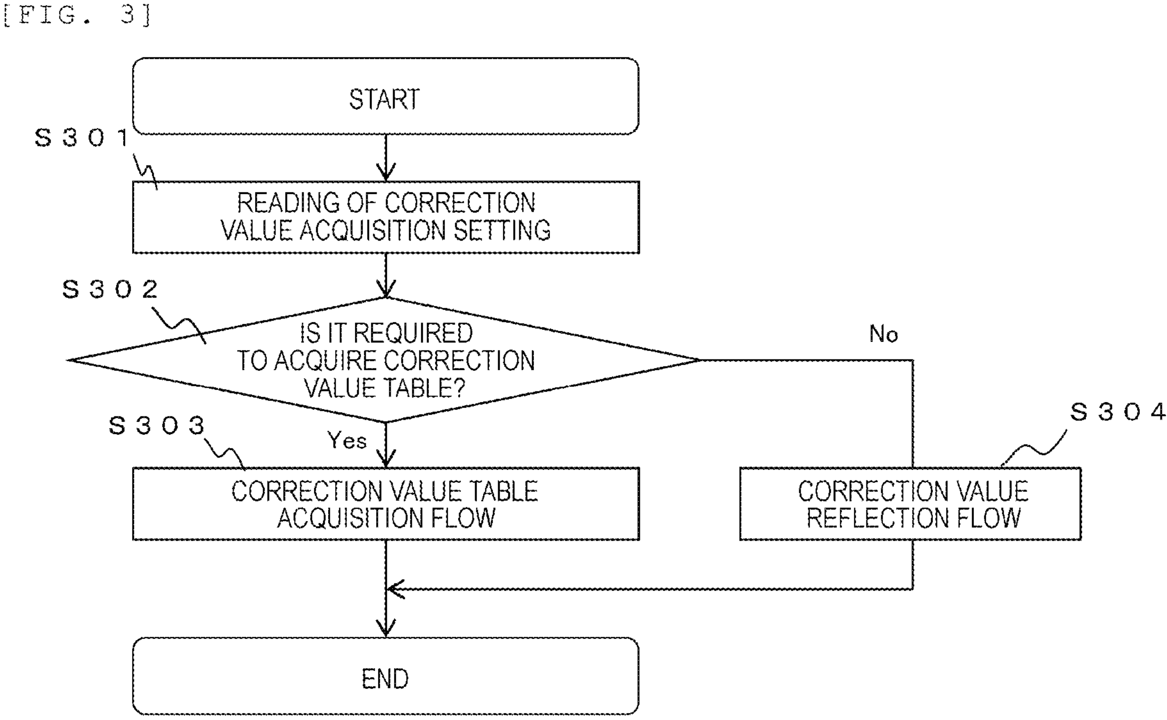

[FIG. 4]
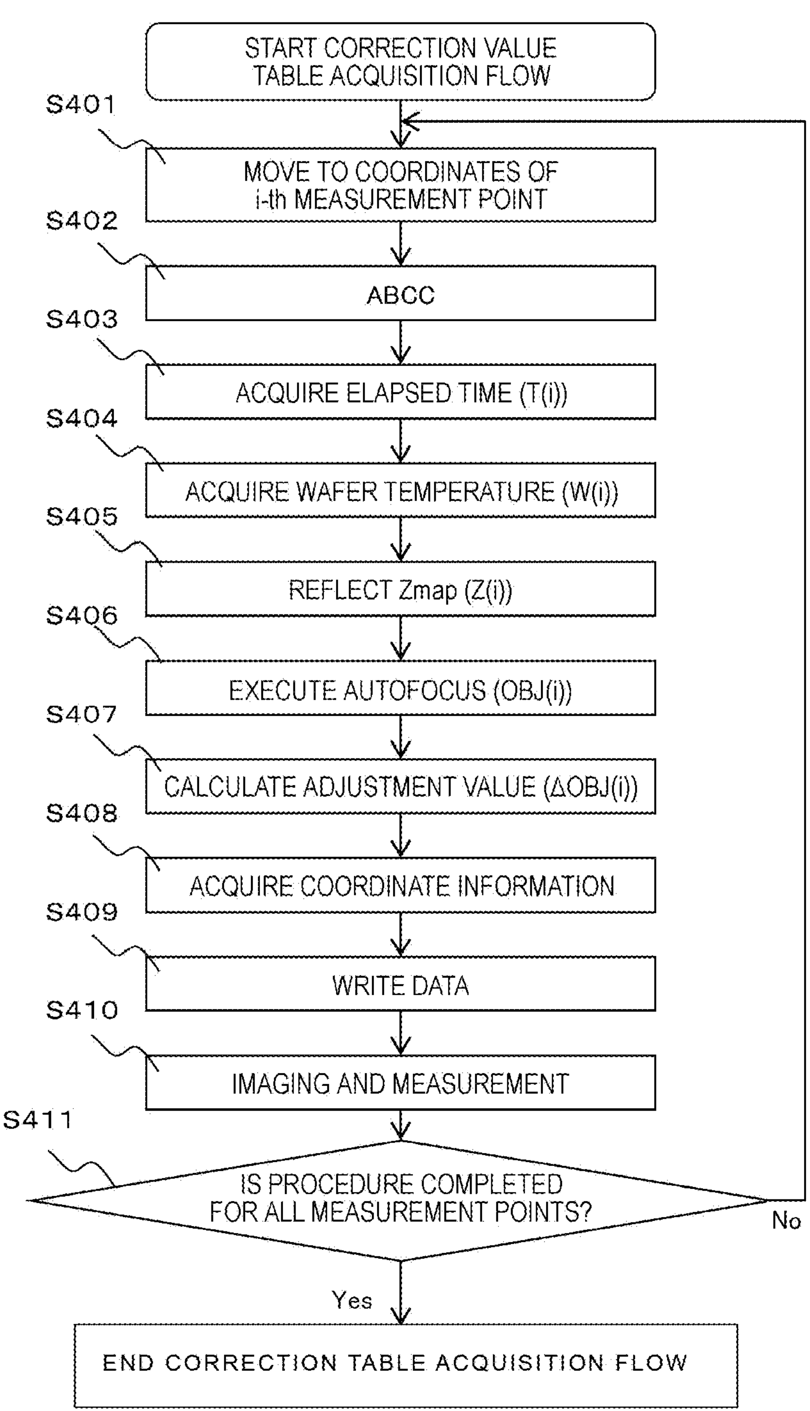

[FIG. 5]
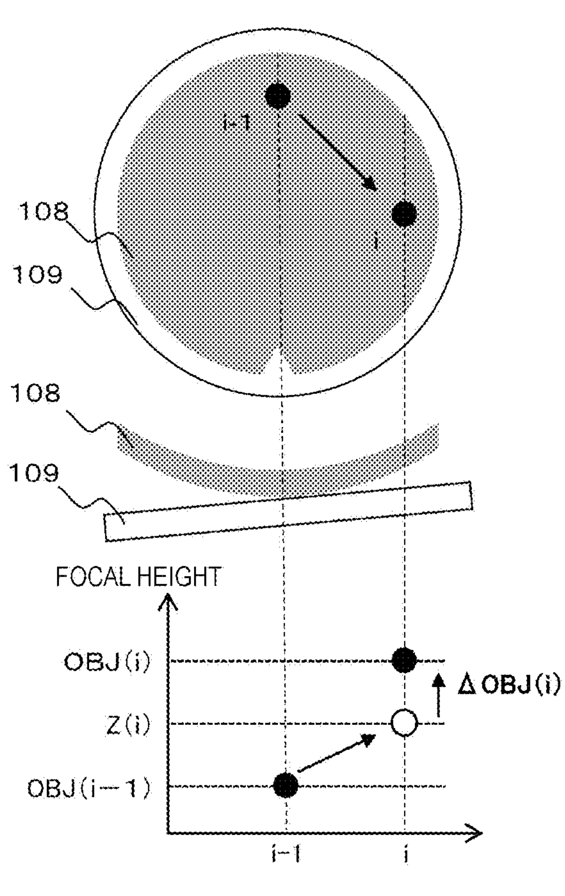

[FIG. 6]
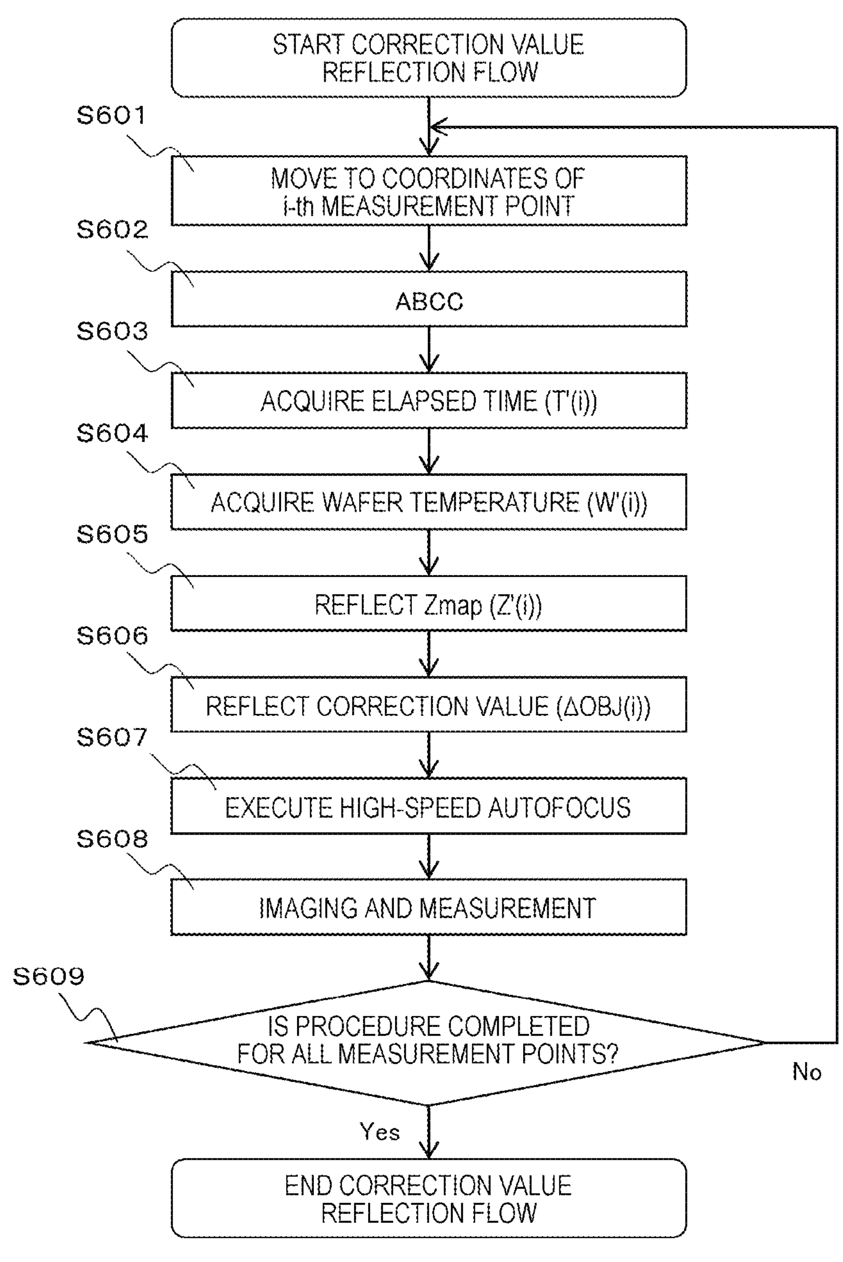

[FIG. 7]
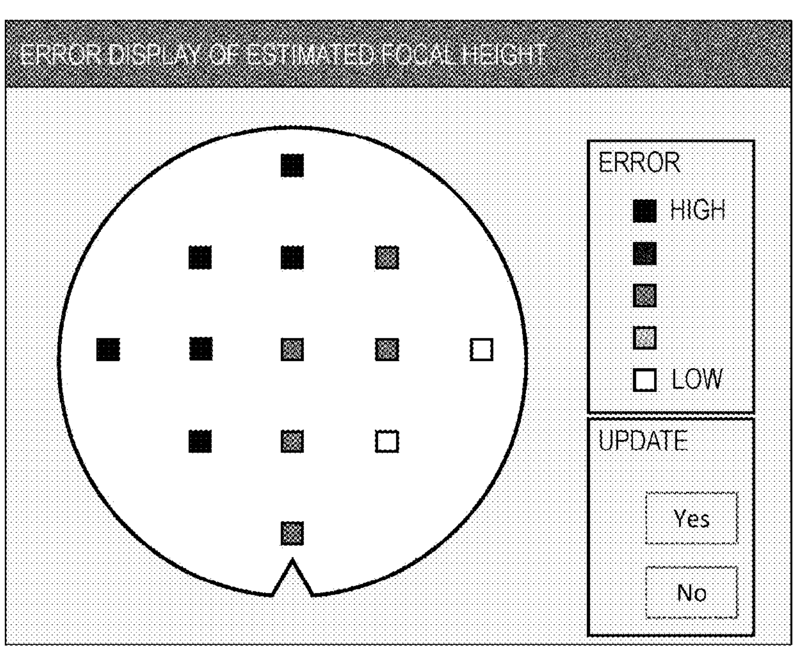
FIG. 8A
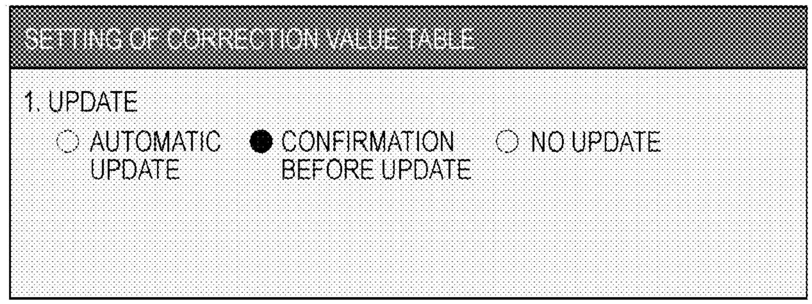
FIG. 8B
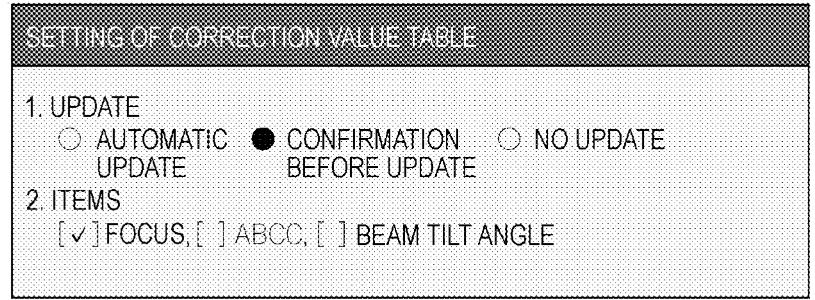

[FIG. 9]
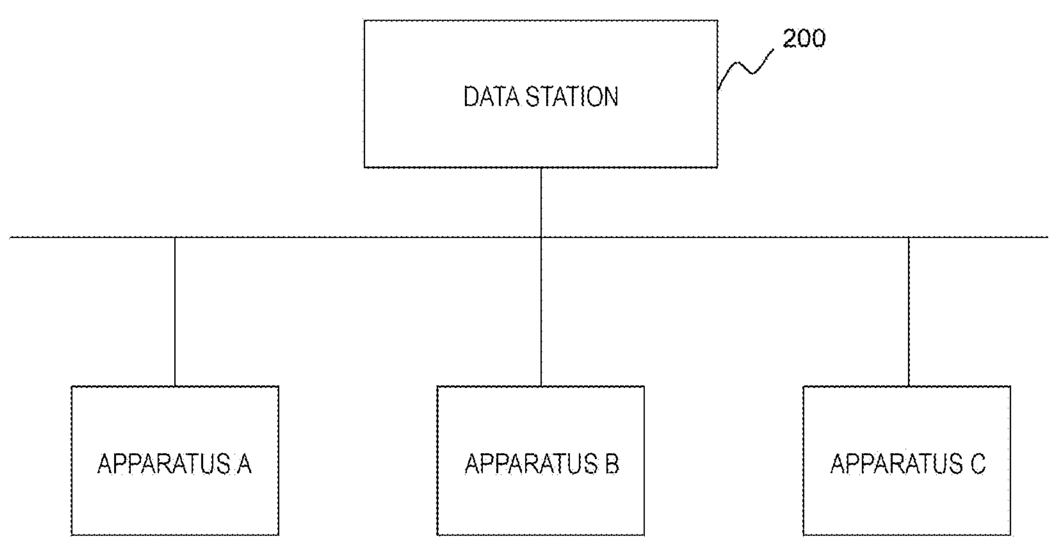

[FIG. 10]
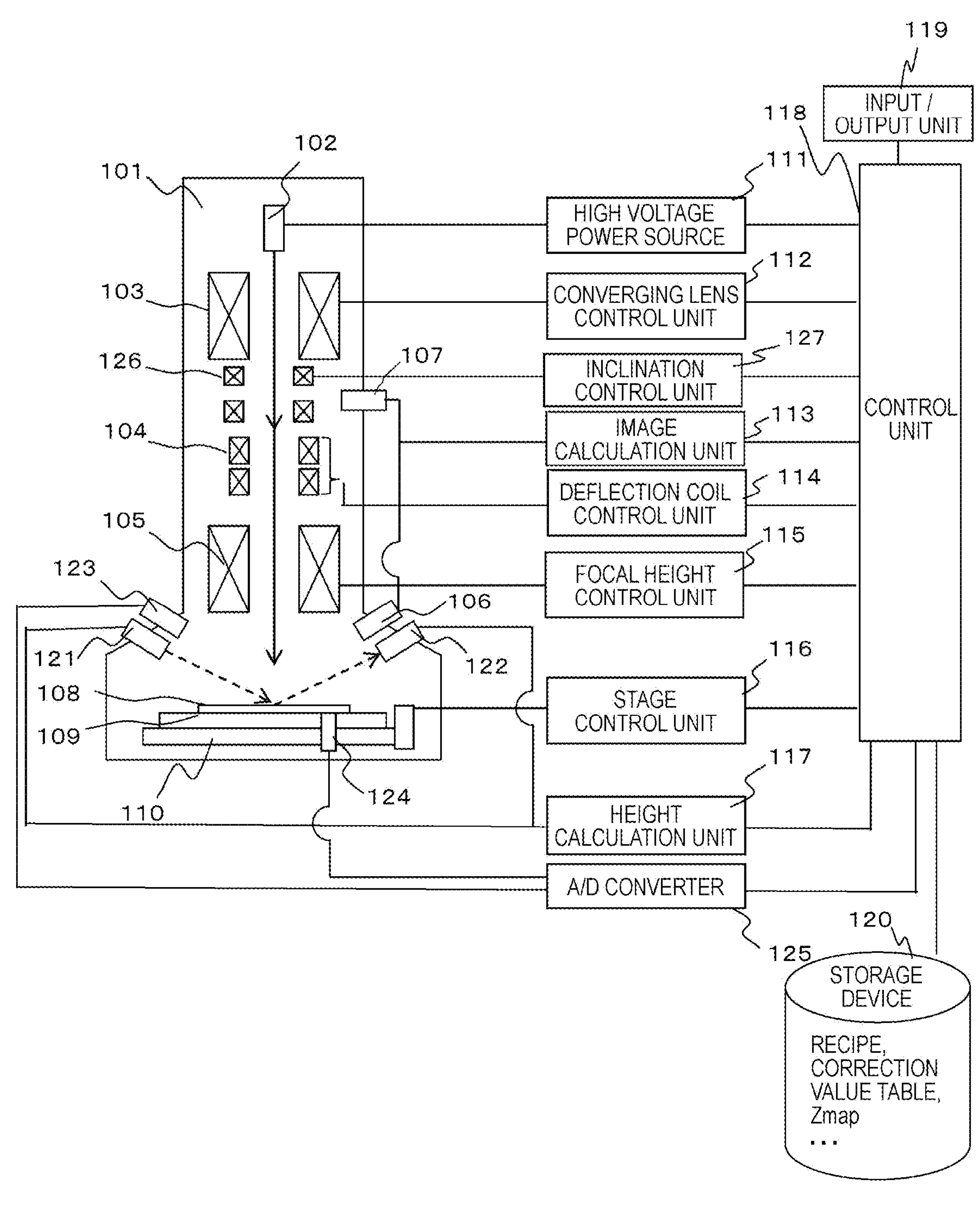

[FIG. 11]
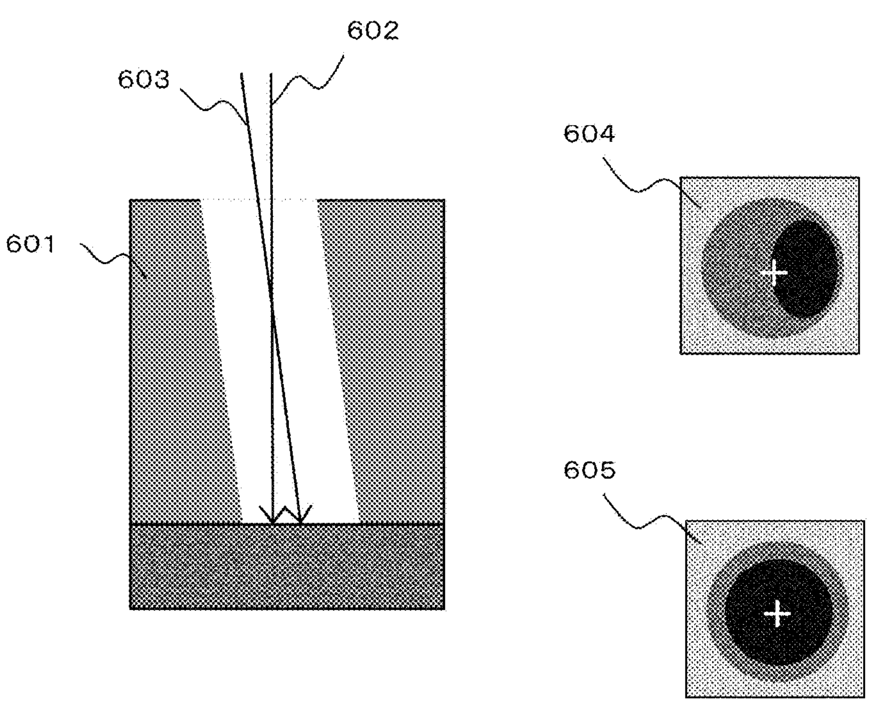

[FIG. 12]
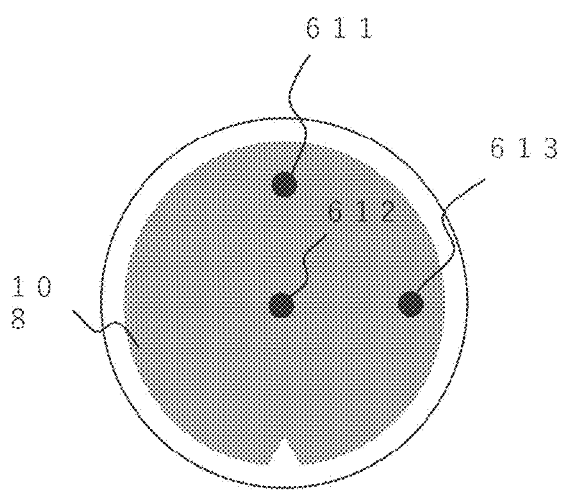
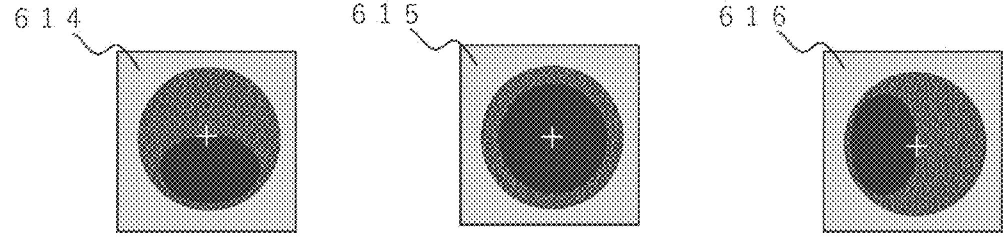

[FIG. 13]
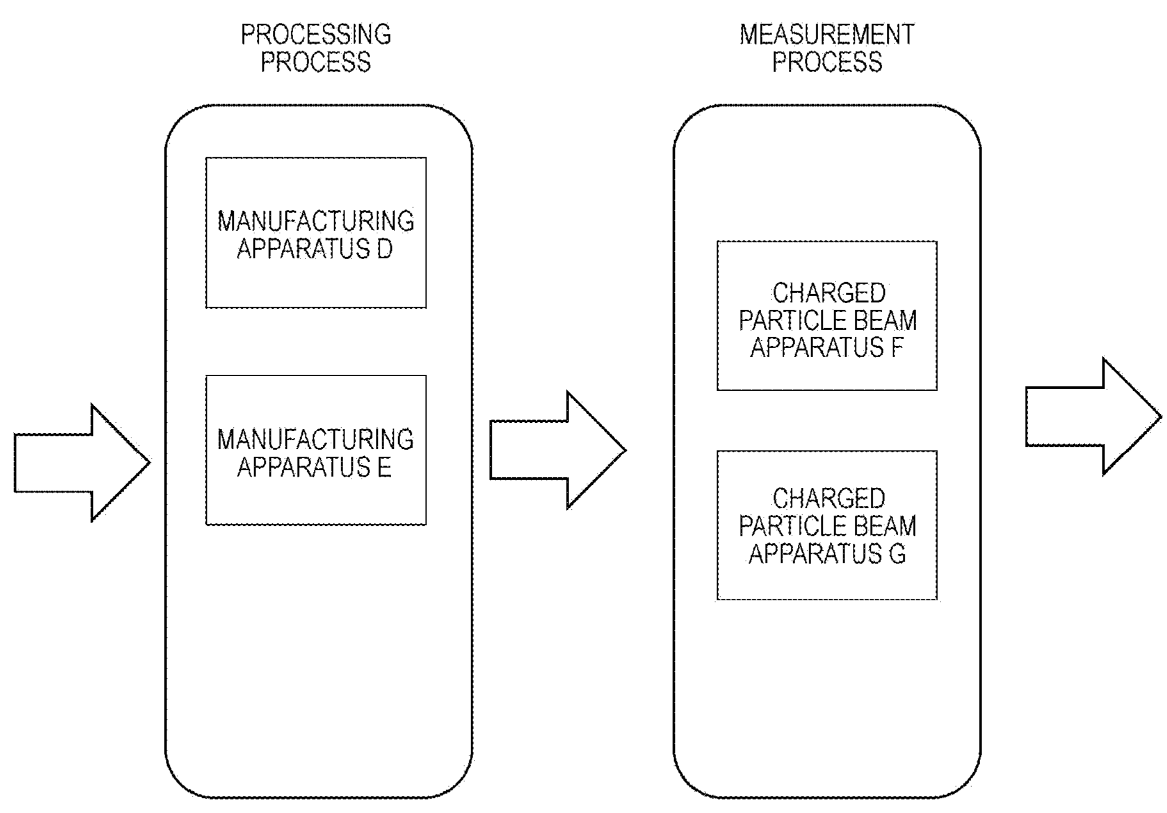

[FIG. 14]

BEAM TILT CORRECTION TABLE OF RECIPE A

| MEASUREMENT ORDER | COORDINATES | MANUFACTURING APPARATUS-D | | MANUFACTURING APPARATUS-E | |
|---|---|---|---|---|---|
| | | Tilt_X | Tilt_Y | Tilt_X | Tilt_Y |
| 1 | (X(1), Y(1) ) | TX-A (1) | TY-A (1) | TX-B (1) | TY-B (1) |
| 2 | (X(2), Y(2) ) | TX-A (2) | TY-A (2) | TX-B (2) | TY-B (2) |
| 3 | (X(3), Y(3) ) | TX-A (3) | TY-A (3) | TX-B (3) | TY-B (3) |
| . | . | . | . | . | . |
| . | . | . | . | . | . |
| n | (X(n), Y(n) ) | TX-A (n) | TY-A (n) | TX-B (n) | TY-B (n) |

[FIG. 15]
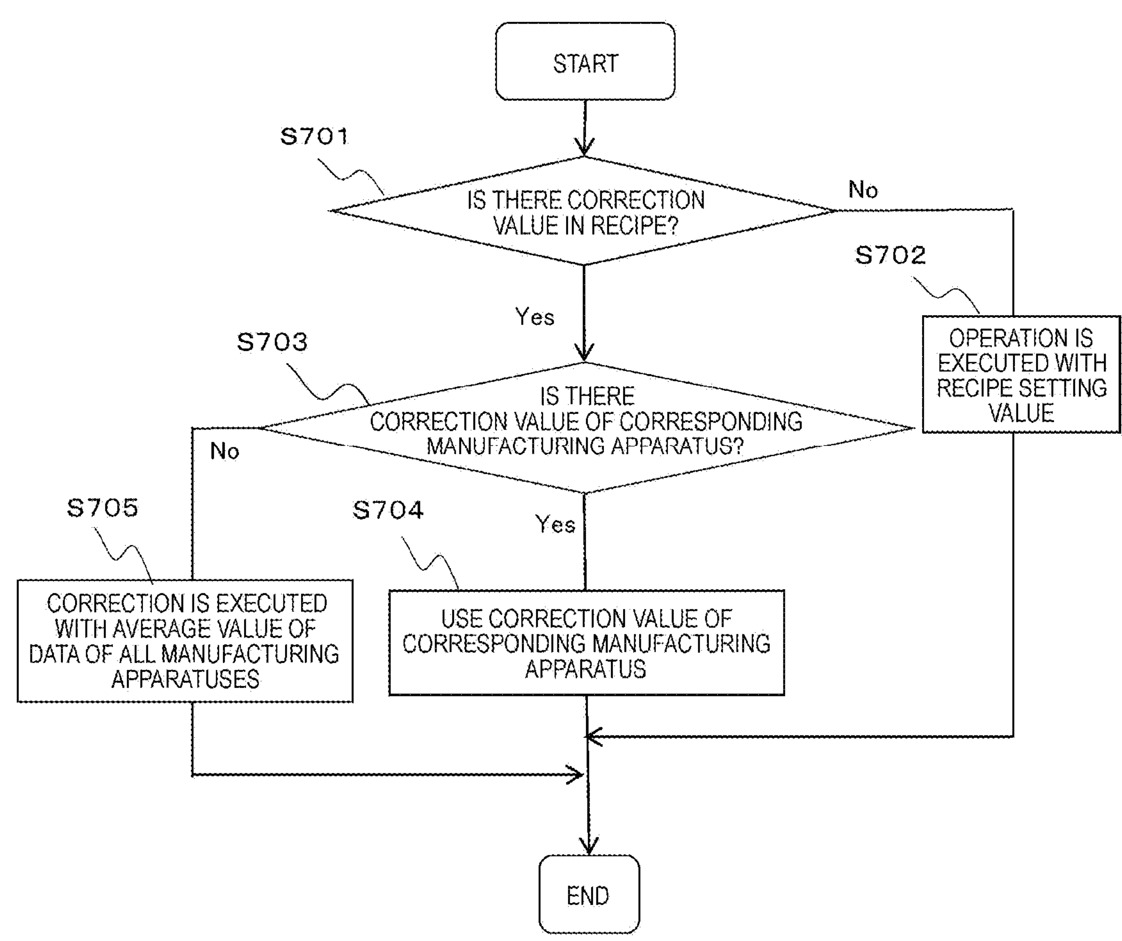

[FIG. 16]
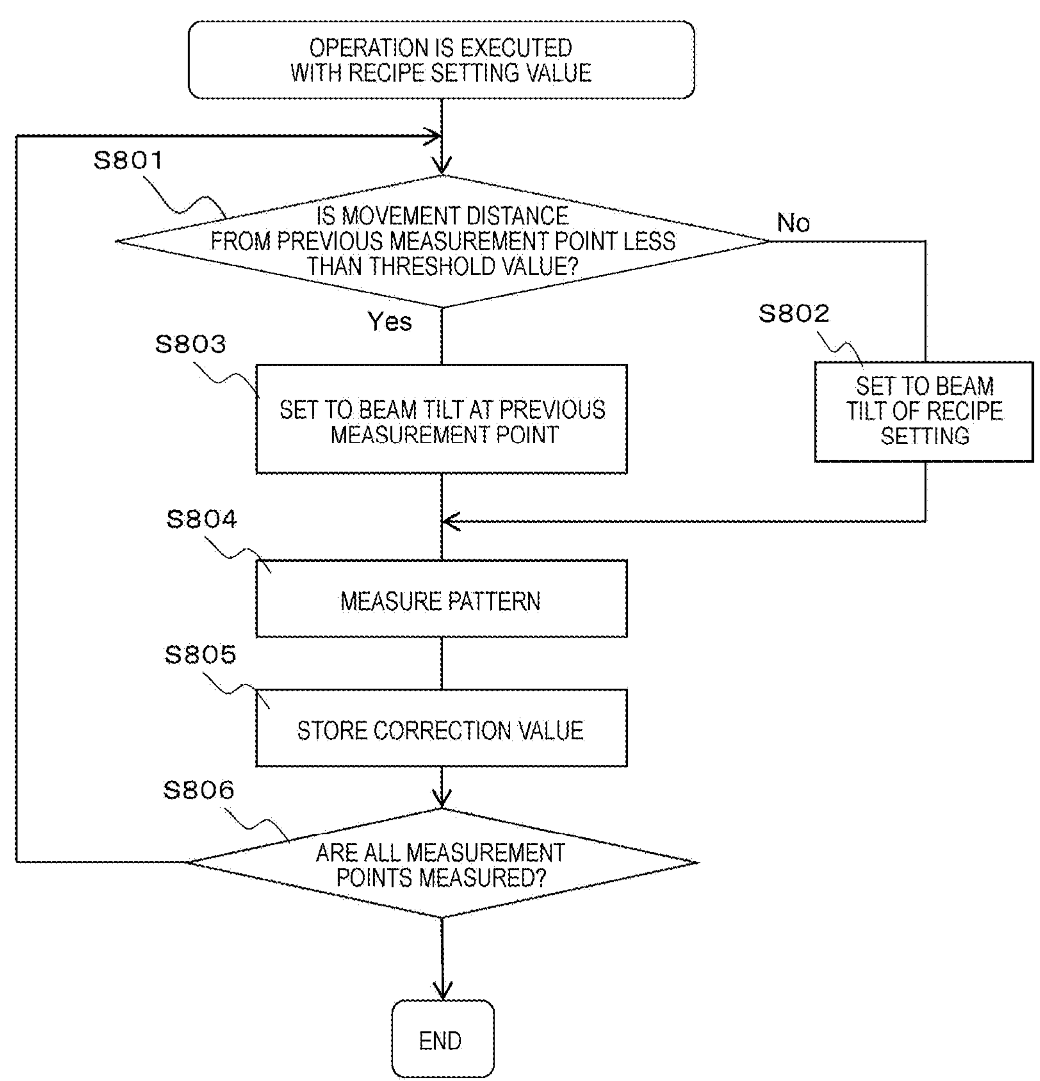

[FIG. 17]
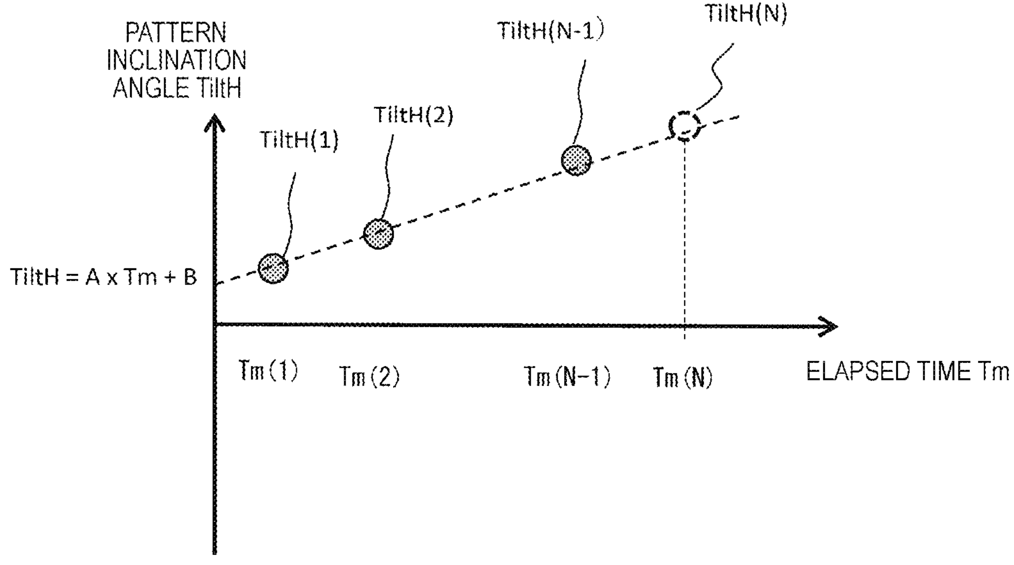

[FIG. 18]

BEAM TILT CORRECTION TABLE

| MEASUREMENT ORDER | COORDINATES | CHARGED PARTICLE BEAM APPARATUS | |
|---|---|---|---|
| | | Tilt_X | Tilt_Y |
| 1 | (X(1), Y(1) ) | TX-Z (1) | TY-Z (1) |
| 2 | (X(2), Y(2) ) | TX-Z (2) | TY-Z (2) |
| 3 | (X(3), Y(3) ) | TX-Z (3) | TY-Z (3) |
| . | . | . | . |
| . | . | . | . |
| n | (X(n), Y(n) ) | TX-Z (n) | TY-Z (n) |

[FIG. 19]

BEAM TILT CORRECTION AMOUNT DURING RECIPE EXECUTION

| MEASUREMENT ORDER | COORDINATES | CORRECTION AMOUNT DURING RECIPE EXECUTION | |
|---|---|---|---|
| | | Tilt_X | Tilt_Y |
| 1 | (X(1), Y(1) ) | TX-A (1) + TX-Z (1) | TY-A (1) + TY-Z (1) |
| 2 | (X(2), Y(2) ) | TX-A (2) + TX-Z (2) | TY-A (2) + TY-Z (2) |
| 3 | (X(3), Y(3) ) | TX-A (3) + TX-Z (3) | TY-A (3) + TY-Z (3) |
| . | . | . | . |
| . | . | . | . |
| n | (X(n), Y(n) ) | TX-A (n) + TX-Z (n) | TY-A (n) + TY-Z (n) |

[FIG. 20]
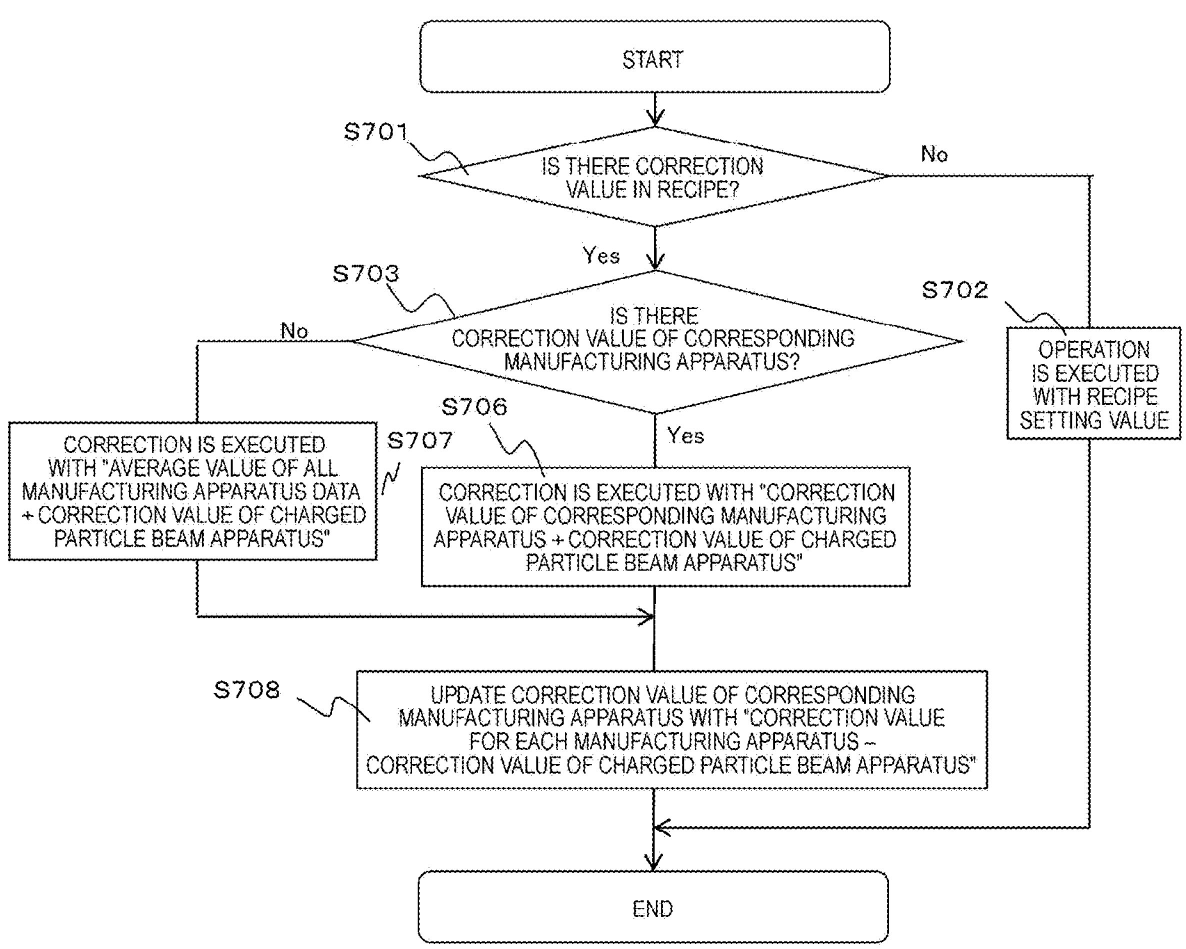

CHARGED PARTICLE BEAM APPARATUS

TECHNICAL FIELD

The present disclosure relates to a charged particle beam apparatus.

BACKGROUND ART

A charged particle beam apparatus such as a scanning electron microscope is known as a device configured to measure various shapes of a sample. The sample is, as an example, a semiconductor device formed by overlaying a plurality of layers. The semiconductor device is generally manufactured by repeating a process of transferring a pattern formed on a photomask onto a wafer by lithography processing or etching processing and overlaying a plurality of layers. In such a manufacturing process, it is important to manage an overlay error between the plurality of layers in order to improve the yield.

With the recent progress in miniaturization of a semiconductor device, it is significantly required to measure an overlay error between an upper layer and a lower layer of the semiconductor device with high accuracy. In order to measure the overlay error therebetween with high accuracy, even in the case of inspection using a scanning electron microscope, the number of measurement points required per wafer is increasing year by year, and the demand for shortening the measurement time per measurement point is increasing.

A technique described in PTL 1 is known as a technique that meets the demand for shortening the measurement time. In PTL 1, disclosed is a technique in which, in order to shorten the time required for autofocus, the height distribution of a wafer is acquired in advance using an optical height detector, and the focusing height of each measurement point is predicted to execute autofocus. However, this method is used to acquire the height distribution in advance using a bare wafer, and the same is not sufficient for shortening the measurement time.

CITATION LIST

Patent Literature

PTL 1: JP3542478B

SUMMARY OF INVENTION

Technical Problem

The present disclosure provides a charged particle beam apparatus capable of shortening the time required for measurement of a sample and measuring the sample with high throughput.

Solution to Problem

In order to solve the above-described problems, a charged particle beam apparatus configured to measure a sample by irradiating the sample with a charged particle beam includes: a storage device configured to store a correction value table corresponding to a recipe; and a computer system configured to execute measurement on a plurality of measurement points of the sample according to a measurement order determined in the recipe. The computer system stores, when executing the recipe on a first sample, an adjustment result of one or more imaging conditions in the correction value table at each of a plurality of measurement points of the first sample, and adjusts, when executing the recipe on a second sample different from the first sample, the imaging condition based on the adjustment result of the one or more imaging conditions stored in the correction value table at each of the plurality of measurement points.

Advantageous Effects of Invention

According to the present disclosure, it is possible to provide a charged particle beam apparatus capable of shortening the time required for measurement of a sample and measuring the sample with high throughput.

BRIEF DESCRIPTION OF DRAWINGS

FIG. 1 is a schematic diagram illustrating a charged particle beam apparatus using a scanning electron microscope (SEM) according to a first embodiment.

FIG. 2 illustrates an example of a correction value table stored in a storage device 120.

FIG. 3 is a flowchart illustrating an operation of acquiring a correction value of the correction value table and reflecting the correction value in the charged particle beam apparatus according to the first embodiment.

FIG. 4 is a flowchart illustrating the operation of acquiring the correction value of the correction value table and reflecting the correction value in the charged particle beam apparatus according to the first embodiment.

FIG. 5 is a schematic diagram illustrating the operation of acquiring the correction value of the correction value table and reflecting the correction value in the charged particle beam apparatus according to the first embodiment.

FIG. 6 is a flowchart illustrating the operation of acquiring the correction value of the correction value table and reflecting the correction value in the charged particle beam apparatus according to the first embodiment.

FIG. 7 is a schematic diagram illustrating a charged particle beam apparatus using a scanning electron microscope (SEM) according to a second embodiment.

FIGS. 8A and 8B are schematic diagrams illustrating the charged particle beam apparatus using the scanning electron microscope (SEM) according to the second embodiment.

FIG. 9 is a schematic diagram illustrating a charged particle beam apparatus using a scanning electron microscope (SEM) according to a sixth embodiment.

FIG. 10 is a schematic diagram illustrating a charged particle beam apparatus using a scanning electron microscope (SEM) according to a seventh embodiment.

FIG. 11 is a schematic diagram illustrating the charged particle beam apparatus using the scanning electron microscope (SEM) according to the seventh embodiment.

FIG. 12 is a schematic diagram illustrating the charged particle beam apparatus using the scanning electron microscope (SEM) according to the seventh embodiment.

FIG. 13 is a schematic diagram illustrating the charged particle beam apparatus using the scanning electron microscope (SEM) according to the seventh embodiment.

FIG. 14 is a schematic diagram illustrating the charged particle beam apparatus using the scanning electron microscope (SEM) according to the seventh embodiment.

FIG. 15 is a flowchart illustrating the operation of the charged particle beam apparatus using the scanning electron microscope (SEM) according to the seventh embodiment.

FIG. 16 is a flowchart illustrating the operation of the charged particle beam apparatus using the scanning electron microscope (SEM) according to the seventh embodiment.

FIG. 17 is a schematic diagram illustrating a charged particle beam apparatus using a scanning electron microscope (SEM) according to an eight embodiment.

FIG. 18 is a schematic diagram illustrating a charged particle beam apparatus using a scanning electron microscope (SEM) according to a ninth embodiment.

FIG. 19 is a schematic diagram illustrating the charged particle beam apparatus using the scanning electron microscope (SEM) according to the ninth embodiment.

FIG. 20 is a flowchart illustrating the operation of the charged particle beam apparatus using the scanning electron microscope (SEM) according to the ninth embodiment.

DESCRIPTION OF EMBODIMENTS

Hereinafter, embodiments will be described with reference to the accompanying drawings. In the accompanying drawings, functionally identical elements may be displayed with the same number. Although the attached drawings illustrate embodiments and implementation examples in accordance with the principles of the present disclosure, these embodiments and implementation examples are described for the understanding of the present disclosure and are not intended to be used to interpret the present disclosure in a limiting manner. The description in this specification is only a typical example and is not intended to limit the scope of the claims or the application example of the present disclosure in any way.

The embodiments are described in sufficient detail to enable those skilled in the art to implement the present disclosure, and it should be understood that other implementations and forms are possible, and that it is possible to change a configuration and a structure and replace various elements without departing from the scope and spirit of the technical ideas of the present disclosure. Therefore, the following descriptions should not be construed as being limited thereto.

In the following embodiments, an example using a scanning electron microscope will be described as an example of a charged particle beam apparatus. This is merely an example of the present disclosure, and the present disclosure is not limited to the embodiments described below. In the present disclosure, a charged particle beam apparatus broadly includes an apparatus configured to capture an image of a sample such as a wafer using a charged particle beam. Examples of the charged particle beam apparatus include an inspection apparatus, a review apparatus, and a pattern measurement apparatus using a scanning electron microscope. The charged particle beam apparatus is also applicable to a wafer processing apparatus or a wafer analysis apparatus provided with a general-purpose scanning electron microscope or a scanning electron microscope. In the following descriptions, the charged particle beam apparatus includes a system in which the charged particle beam apparatuses are connected via a network and a composite apparatus of the charged particle beam apparatuses.

First Embodiment

A charged particle beam apparatus using a scanning electron microscope (SEM) according to a first embodiment will be described with reference to a schematic diagram in FIG. 1. The scanning electron microscope according to the first embodiment includes an imaging device 101, a control unit 118 configured to control the imaging device 101, and a storage device 120 configured to store various data for control.

The imaging device 101 includes therein an electron source 102, a converging lens 103, a deflection coil 104, an objective lens 105, a detector 106, a detector 107, an electrostatic chuck 109, a stage movable unit 110, a light source 121, a height sensor 122, and temperature sensors 123 and 124.

Primary electrons emitted from the electron source 102 are converged by the converging lens 103 and the objective lens 105, and a wafer 108 (sample) is scanned two-dimensionally by the primary electrons using the deflection coil 104. The electron source 102 generates and emits a primary electron with a high voltage supplied from a high voltage power source 111. The converging lens 103 is controlled by a converging lens control unit 112, and the deflection coil 104 is controlled by a deflection coil control unit 114. Further, the focal position of the objective lens 105 is controlled by a focal height control unit 115.

A signal electron generated from the wafer 108 by primary electron irradiation is classified into a secondary electron and a backscattered electron according to kinetic energy, and the secondary electron and the backscattered electron are detected by the detectors 106 and 107, respectively. Outputs from the detectors 106 and 107 are supplied to an image calculation unit 113 to calculate and generate an image based on the secondary electron and the backscattered electron. The image calculation unit 113 generates an image by associating the scanning position of the primary electron with a pixel. The generated image is transmitted to an input/output unit 119 (for example, a monitor or the like) via the control unit 118, and an SEM image of the wafer 108 is displayed thereon.

The electrostatic chuck 109 and the stage movable unit 110 form a stage having the wafer 108 mounted thereon. The electrostatic chuck 109 is configured to electrostatically attract and hold the wafer 108, which is an object to be inspected (sample). The stage movable unit 110 is controlled by a stage control unit 116 and configured to be able to move the wafer 108 in the two-dimensional direction together with the electrostatic chuck 109. The height of the wafer 108 electrostatically attracted on the electrostatic chuck 109 is measured based on light emitted from the light source 121, the light being reflected on the surface of the wafer 108 and received by the height sensor 122. A detection signal from the temperature sensors 123 and 124 is converted into a digital signal by an A/D converter 125 and the digital signal is supplied to the control unit 118.

The control unit 118 is configured to control the high voltage power source 111, the converging lens control unit 112, the deflection coil control unit 114, the focal height control unit 115, the stage control unit 116, and a height calculation unit 117. In addition, the control unit 118 measures the shape of a pattern of the wafer 108 according to calculation data obtained from the image calculation unit 113, the height calculation unit 117, and the A/D converter 125, and the same also calculates the height, temperature, and the like of the wafer 108. The imaging device 101 forms an SEM. Although a vacuum vessel, a wafer conveyance system, and the like are mounted on the scanning electron microscope, the same are omitted in FIG. 1 for the sake of simplicity of description.

Further, the primary electron may be emitted so that the incident angle (beam tilt angle) of the primary electron on the wafer 108 becomes a desired angle. The electron source 102 can also use the high voltage power source 111 to change a voltage applied between the cathode and anode of an electron gun, thereby allowing an accelerated electron to be emitted. This voltage is referred to as an acceleration voltage. In the case of the charged particle beam apparatus according to the first embodiment as well, a primary electron can be emitted under a plurality of acceleration voltage conditions.

The storage device 120 stores a recipe, a correction value table linked to the recipe, bare wafer height information Zmap, and the like. The recipe is a data group that designates an execution procedure of measurement together with coordinates of a measurement point and measurement conditions when the measurement of the wafer 108 is executed. The measurement conditions refer to information including a visual field size, an imaging magnification, a pattern design dimension, and the like. Hereinafter, executing a series of measurements on one wafer according to a recipe is simply described as "executing a recipe". The bare wafer height information Zmap is information related to the height distribution of the surface of the wafer 108 (bare wafer) acquired before recipe execution. A method of acquiring and utilizing the bare wafer height information Zmap will be described later.

FIG. 2 illustrates an example of a correction value table stored in the storage device 120. The correction value table is a data group in which an order, a coordinate, an adjustment result of a focal height, an elapsed time, a wafer temperature, and the like of a measurement point when a recipe is executed are collected. Items shown in FIG. 2 are examples, and depending on the operation method, items other than those shown in the drawing may be added, or items shown in the drawing may be deleted.

Next, with reference to flowcharts and schematic diagrams in FIGS. 3 to 6, a description will be given as to an operation of acquiring a correction value of the correction value table and reflecting the correction value in the charged particle beam apparatus according to the first embodiment.

First, correction value acquisition setting data registered in the recipe is read (step S301). A detailed description of this setting will be given later.

Next, in step S302, it is determined whether to acquire a correction value table. For example, when acquisition of the correction value table is selected in the correction value acquisition setting data read in step S301, or when the correction value table associated with the recipe to be executed does not exist in the storage device 120, the processing proceeds to the flow of acquiring the correction value table (step S303). On the other hand, when it is not set to acquire the correction value table, a correction value reflection flow (step S304) is executed to reflect the already acquired correction value table to a measurement result according to the recipe.

Details of the correction teble acquisition flow (step S303) will be described with reference to the flowchart of FIG. 4. Here, a description will be given as to processing necessary to calculate a correction value (ΔOBJ(i)). In the following descriptions, the number of measurement points registered in the recipe is defined as n, and a variable i (=1, 2, 3 . . . , n) used in the description indicates the order of any measurement point in the recipe.

First, the stage movable unit 110 is driven so that the i-th measurement point registered in the recipe can be irradiated with a primary electron (step S401). The stage movable unit 110 can be moved to a desired position by a control signal from the stage control unit 116. Since the wafer 108 is electrostatically attracted and strongly held by the electrostatic chuck 109, the wafer 108 is not separated from the stage movable unit 110 even when the stage movable unit 110 is moved.

Next, in order to acquire an image with appropriate brightness at the measurement point moved in step S401, automatic brightness and contrast control (ABCC) is executed (step S402). This ABCC can be executed as processing of adjusting the amplification factor of an image signal in the image calculation unit 113. The ABCC can be adjusted by determining a brightness adjustment value (brightness value) and a contrast adjustment value (contrast value) according to a material of the wafer 108, a charged state of the wafer 108, and the like.

Next, data of a time T(i) when the measurement at the i-th measurement point ends is acquired (step S403). Then, an elapsed time ΔT(i) (=T(i)−T(1)) from the end of the measurement at the first measurement point to the end of the measurement at the i-th measurement point is measured.

Next, a temperature W(i) of the wafer 108 is measured (step S404). The temperature of the wafer 108 can be measured by the sensors 123 and 124, and a temperature measurement signal (analog signals) is converted into digital data by the A/D converter 125.

Next, the bare wafer height information Zmap is read out to predict a wafer height Z(i) at the i-th measurement point, and the focal height of the primary electron is adjusted (step S405). A method of acquiring the bare wafer height information Zmap is described below. When the height of any point on the surface of the wafer 108 (bare wafer) is measured, the any point on the wafer 108 is obliquely irradiated with light from the light source 121. Irradiation light reflected at the any point is incident on the height sensor 122. A signal obtained by the height sensor 122 is converted into height information of the wafer 108 by the height calculation unit 117. By executing such measurement on the entire surface of the wafer 108 at any intervals on the plane, the in-plane height distribution of the wafer 108 can be obtained, and a set of the measurement results can be acquired as the bare wafer height information Zmap. The bare wafer height information Zmap is stored in the storage device 120 and read out when the recipe is executed. The wafer 108 to be measured at the time of acquiring the bare wafer height information Zmap is a bare wafer on which any processing is not performed. As a reason why a bare wafer is used, the light emitted from the light source 121 is scattered by a surface pattern, which makes it difficult to measure the height accurately.

Next, autofocus is executed to adjust a focal height OBJ(i) so that the primary electron is focused on the wafer 108 (step S406). The autofocus is an operation of automatically controlling the focal position of the objective lens 105 by, for example, the control of the focal height control unit 115 so that the primary electron is focused on the surface of the wafer 108. A plurality of images are acquired while changing the focal height in a state in which a position separated by a distance d1 from a focal height Z(i) of the primary electron according to the bare wafer height information Zmap is defined as an initial position. Sharpness of the plurality of images are compared with each other to calculate the optimum focal height, and the focal height control unit 115 controls a current of the objective lens to set the focal height OBJ(i) so that the primary electron is focused on the wafer 108.

Next, calculation is executed to acquire an adjustment value ΔOBJ(i) (=OBJ(i)−Z(i)) as a difference between the focal height Z(i) of the primary electron after reflection of the bare wafer height information Zmap and the focal height OBJ(i) of the primary electron after execution of autofocus (step S407).

Next, coordinates (X(i), Y(i)) of the i-th measurement point are acquired (step S408). Then, various pieces of data (coordinates, adjustment value ΔOBJ(i), elapsed time ΔT(i), and wafer temperature W(i)) obtained at the i-th measurement point are written in the correction value table (step S409).

Subsequently, an image of the wafer 108 is captured according to the measurement conditions registered in the recipe, and various measurements such as a measurement on an overlay error between an upper layer and a lower layer of the wafer 108 are executed (step S410). The above-described procedure is repeatedly executed until the above-described procedure is completed at all the measurement points (step S411).

FIG. 5 is a schematic diagram illustrating an example of a change in focal height OBJ during the measurement at the (i−1)-th measurement point and the measurement at the i-th measurement point in the recipe. The upper diagram in FIG. 5 illustrates a plan view of the wafer 108 and the electrostatic chuck 109, and the middle diagram in FIG. 5 illustrates a longitudinal cross-sectional view thereof. Further, the lower graph is a graph illustrating a change in focal height OBJ between the (i−1)-th measurement point and the i-th measurement point.

As illustrated in the middle diagram of FIG. 5, the wafer 108 may not have a uniform height distribution in the plane thereof due to CMP, etching, or the like during the manufacturing process. Further, the electrostatic chuck 109 may not be completely horizontally assembled when the same is assembled to the imaging device 101.

As illustrated in the lower diagram of FIG. 5, at the i-th measurement point, the focal height Z(i) is obtained in such a manner that a height change caused by the electrostatic chuck 109 is corrected by reflecting the bare wafer height information Zmap, but a height change caused by the wafer 108 remains uncorrected. The height variation is corrected by executing an autofocus operation, thereby obtaining the focal height OBJ(i) and calculating the adjustment value ΔOBJ(ij).

Details of the correction value reflection flow in step S304 of FIG. 3 will be described with reference to the flowchart in FIG. 6. Here, a description will be given as to processing of reflecting the correction value acquired in step S303 of FIG. 3.

First, the stage movable unit 110 is moved so that the i-th measurement point registered in the recipe can be irradiated with a primary electron (step S601). Next, ABCC is executed to acquire an image having appropriate brightness at the i-th measurement point (step S602).

Subsequently, data at a time T'(i) when the measurement at the i-th measurement point is completed is acquired (step S403). An elapsed time T'(i) can generally be set to the elapsed time T(i) acquired in step S403. Then, an elapsed time ΔT'(i) (=T'(i)−T'(1)) from the end of the measurement at the first measurement point to the end of the measurement at the i-th measurement point is measured.

Next, a wafer temperature W'(i) is acquired (step S604). The wafer temperature W'(i) can generally be set to the wafer temperature data W(i) acquired in step S404.

Next, regarding the i-th measurement point, the wafer height at the i-th measurement point is predicted according to the bare wafer height information Zmap read from the storage device 120, and the focal height of the primary electron is adjusted to Z'(i) according to the prediction (step S605). Subsequently, the correction value table is read from the storage device 120, the adjustment value ΔOBJ(i) corresponding to the i-th measurement point is specified, and the specified adjustment value ΔOBJ(i) is reflected in the focal height of the primary electron (step S606). A focal height OBJ_x(i) after reflecting the adjustment value ΔOBJ(i) is obtained.

According to the focal height OBJ_x(i) after reflecting the adjustment value ΔOBJ(i) obtained in this manner, high-speed autofocus is executed to adjust the focal height of the primary electron to OBJ'(i) (step S607). This autofocus operation can be executed by moving the initial position away from the current focal height of the primary electron by d2 (<d1) in comparison with the autofocus operation in step S403 of FIG. 4. As the initial position is closer, the focusing position can be reached at a higher speed. In other words, since the autofocus operation starts from the position at which the adjustment value ΔOBJ(i) caused by the manufacturing process is added to the focal height, it is possible to reduce the risk of re-execution of autofocus due to failure and implement a high-speed autofocus operation.

Imaging and measurement are executed according to the measurement conditions registered in the recipe in a state in which the correction value by the correction value table is reflected in this manner (step S608). The above-described processing is repeatedly executed at all the measurement points registered in the recipe (step S609).

As described above, with the scanning electron microscope of the first embodiment, the autofocus operation starts from the position at which the adjustment value ΔOBJ(i) caused by the manufacturing process is added to the focal height, thereby making it possible not only to reduce the risk of re-execution of autofocus due to failure, but also to implement a high-speed autofocus operation.

Second Embodiment

Next, a charged particle beam apparatus using a scanning electron microscope (SEM) according to a second embodiment will be described with reference to FIG. 7. Since the overall configuration and basic operation of the apparatus are the same as those of the first embodiment (FIGS. 1 to 6), redundant description will be omitted and only differences will be described.

In the second embodiment, the control unit 118 is configured so that the correction value table can be updated. Specifically, after the correction value reflection flow (FIG. 6) is executed in the same manner as in the first embodiment, calculation is executed to acquire, as an error E(i) (=OBJ'(i)−OBJ_x(i)), a difference between the focal height OBJ_x(i) after reflection of the adjustment value ΔOBJ(i) and the focal height OBJ'(i) after execution of the high-speed autofocus operation (in other words, a difference in focal height before and after focus adjustment by the high-speed autofocus (=OBJ'(i)−OBJ_x(i)) is calculated as an error of the adjustment value ΔOBJ(i)). Then, as illustrated in FIG. 7, this error E(i) is displayed on a display or the like. For example, as illustrated in FIG. 7, the error E(i) can be displayed by a graphical display showing the positions of a plurality of measurement points on the wafer 108 and a dot display at each of the plurality of measurement points. The size of the error E(i) can be displayed by dots color-coded as illustrated in FIG. 7. Alternatively, it is also possible to display the error E(i) based on a difference between numerical values and dot shapes. By displaying the error E(i) for each measurement point as in the display of the screen in FIG. 7, the distribution of the error E(i) can be confirmed.

An operator confirms, by the display on this display, the error E(i) generated after the correction value of the correction value table is reflected, and determines whether the correction value of the correction value table stored in the storage device 120 is good or bad. When determining that the adjustment value ΔOBJ(i) is not accurate, the operator can discard the existing correction value table and reacquire (update) a new correction value table obtained by reflecting the error ΔE(i). By pressing the icon of the update "Yes" at the bottom right of the screen in FIG. 7, it is possible to acquire the correction value table obtained by reflecting the measured error ΔE(i) instead of the stored correction value table. Conversely, by pressing the icon of "No", the stored correction value table can be continuously used.

Although FIG. 7 illustrates a screen in a case where the update of the correction value table is determined by selection by the operator, the update of the correction value table may be automatically executed regardless of the selection by the operator (automatic update). Further, the correction value table may not be updated, and the first generated correction value table may be continuously used (no update).

FIG. 8A illustrates an example of a GUI screen related to the setting of the correction value table. This GUI screen is a screen configured, when an error after reflection of the correction value of the correction value table is equal to or greater than a predetermined value, to automatically update the correction value table (automatic update), to allow the operator to select whether to update the correction value table before updating the same (confirmation before update), or to select no update of the correction value table (no update). It is also possible to display additional options other than the three options illustrated in the drawing. When "confirmation before update" is selected, the screen in FIG. 7 is displayed, and the operator can select (Yes or No) whether to update the correction value table. When "automatic update" is selected, the screen in FIG. 7 is displayed, and the correction value table is automatically updated without pressing the icon of Yes/No. Thereafter, information indicating completion of the update is displayed on the display screen.

FIG. 8B illustrates another example of the GUI screen related to the setting of the correction value table. In this GUI screen, in addition to the selection of "automatic update", "update confirmation", and "no update" of the correction value table, a screen configured to select a correction item is also displayed. In this example illustrated in the drawing, it is possible to select whether correction related to ABCC and a beam tilt angle is executed in addition to focus.

As described above, according to the second embodiment, the correction value table can be updated automatically or through the selection of the operator, thereby making it possible to further improve the speed of the autofocus operation as compared with the first embodiment.

Third Embodiment

Next, a charged particle beam apparatus using a scanning electron microscope (SEM) according to a third embodiment will be described. Since the overall configuration and basic operation of the apparatus are the same as those of the first embodiment (FIGS. 1 to 6), redundant description will be omitted and only differences will be described.

The third embodiment is different from the above-described embodiments in that the correction value acquisition flow is executed a plurality of times for one recipe, and the storage device 120 stores a plurality of correction value tables for one recipe. In the case of j correction value tables, an adjustment value ΔOBJ_ave(i) reflected in step S606 of FIG. 6 can be calculated by addition average of j adjustment values ΔOBJ(i) as in the following [Equation 1].

$$\Delta OBJ\_ave(i) = (\Delta OBJ\_1(i) + \Delta OBJ\_2(i) + \ldots + \Delta OBJ\_j(i))/j \quad \text{[Equation 1]}$$

Here, ΔOBJ_k(i) (k=1, 2, . . . j) indicates a correction value at the i-th measurement point of the k-th correction value table (k=1, 2, . . . , j). Instead of a uniform average value, it is also possible to calculate a weighted average or an intermediate value.

Such an adjustment value ΔOBJ_ave(i) is acquired for a plurality of measurement points on the wafer 108, a correction value table is acquired, and the acquired correction value table is stored in the storage device 120. By using the correction value table, it is possible to obtain the same effects as those of the above-described embodiments. It is noted that the adjustment value ΔOBJ_ave(i) may be generated in advance before the start of recipe execution and stored in the storage device 120, or the adjustment value ΔOBJ_ave(i) may not be calculated in advance, but the adjustment value ΔOBJ_ave(i) may be calculated in parallel in the middle of processing at individual measurement points and applied.

Fourth Embodiment

Next, a charged particle beam apparatus using a scanning electron microscope (SEM) according to a fourth embodiment will be described. Since the overall configuration and basic operation of the apparatus are the same as those of the first embodiment (FIGS. 1 to 6), redundant description will be omitted and only differences will be described.

The fourth embodiment is different from the above-described embodiments in that, in addition to the adjustment value ΔOBJ(i) included in the correction value table, a focal height is configured to be calculated using a correction term in consideration of the elapsed time T(i) from the start of recipe execution and the wafer temperature W(i). When the elapsed time T(i) from the start of recipe execution changes, the temperatures of the objective lens 105, each control unit, and the imaging device 101 also change. When such a temperature change occurs, the focal height of the primary electron changes.

When the elapsed time T(i) is substantially the same among a plurality of measurements, correction can be sufficiently performed with the fixed adjustment value ΔOBJ(i) as in the first embodiment. However, the elapsed time T(i) varies among the plurality of measurements depending on the number of times of autofocus retry, the number of measurement errors, and the like. Therefore, when the fixed adjustment value ΔOBJ(i) is used among the plurality of measurements, it becomes impossible to execute high-speed autofocus, which may lead to measurement failure. Therefore, a correction term ΔZ_T(i) of a height change due to elapsed time is calculated as shown in the following [Equation 2] by using a function F(T) using, as an input, a difference between the elapsed time T(i) when the adjustment value ΔOBJ(i) is acquired and the elapsed time ΔT'(i) when the adjustment value ΔOBJ(i) is reflected. The calculated correction term Z_T(i) can be reflected in the focal height in addition to the adjustment value ΔOBJ(i) at the time of reflecting the adjustment value ΔOBJ(i) in step S606.

$$\Delta Z\_T(i) = F(\Delta T'(i) - \Delta T(i)) \quad \text{[Equation 2]}$$

In the same manner as that of the temperature change due to the difference in the elapsed time T(i), the wrappage state of the wafer 108 and the electrostatic chuck 109 is changed depending on the temperature, so it is necessary to correct the wrappage. Therefore, it is necessary to grasp the height change using the wafer temperature W(i) acquired during processing at each measurement point. A correction term ΔZ_W(i) of the height change due to the temperature of the wafer 108 is calculated by using a function G (X, Y, W, X0, Y0) using, as an input, each of coordinates (X0, Y0) of the center of the wafer 108, coordinates (X, Y) of the measurement point thereof, and the wafer temperature W(i).

$$\Delta Z\_W(i)=G((X'(i)-X(i)),(Y'(i)-Y(i)),(W'(i)-W(i)),X0,Y0) \quad \text{[Equation 3]}$$

The calculated correction term ΔZ_W(i) can be reflected in the focal height in addition to the adjustment value ΔOBJ(i) and the correction term ΔZ_T(i) at the time of reflecting the adjustment value ΔOBJ in step S606.

It is noted that the above-described functions F and G may be determined in advance using simulation or the like, or may be optimally determined using values of a plurality of correction value tables. Further, AI based on a technique such as deep learning or machine learning may be used to calculate the correction terms ΔZ_T(i) and ΔZ_W(i).

In addition, in the above description, although the function F of the elapsed time T(i) and the function G of the wafer temperature W(i) and coordinates have been described separately, an optimum correction value of the focusing position may be calculated using all or a part of the data stored in the correction value table. AI based on a technique such as deep learning or machine learning may be used to estimate an optimum value from such a large number of parameters.

As described above, according to the fourth embodiment, a focal height is calculated using a correction term in consideration of the elapsed time T(i) and the wafer temperature W(i) in the recipe, thereby making it possible to execute an autofocus operation at a higher speed than in the above-described embodiments.

Fifth Embodiment

Next, a charged particle beam apparatus using a scanning electron microscope (SEM) according to a fifth embodiment will be described. Since the overall configuration and basic operation of the apparatus are the same as those of the first embodiment (FIGS. 1 to 6), redundant description will be omitted and only differences will be described.

The fifth embodiment is different from the above-described embodiments in that, in addition to correction of the focal height, ABCC (brightness value and contrast value) and a beam tilt angle are also configured to be corrected based on a correction value table.

In the fifth embodiment as well, a correction value table is acquired in the same manner as in the first embodiment, and the same is reflected when the high-speed autofocus operation is performed on other wafers (FIGS. 3 and 6). An adjustment result of ABCC can be acquired in step S402 in the same manner as in the first embodiment. However, in the fifth embodiment, the brightness value and the contrast value of ABCC acquired in step S402 are written in the correction value table when data is written in step S409. Thereafter, in step S602 of FIG. 6, the ABCC is executed by reflecting the brightness value and the contrast value read out from the correction value table. It is known that the adjustment result of ABCC changes mainly depending on the charged state of a sample. Therefore, when the recipe is executed in the same measurement order, the charged state of the sample is reproduced. Therefore, as described above, it is possible to use the adjustment result of ABCC executed on the same wafer and written in the correction value table at the time of measuring other wafers. Accordingly, it is possible to shorten the time required for execution of ABCC.

The same applies to correction of a beam tilt angle. An optimum beam tilt angle of an incident primary electron is determined by warpage of the wafer 108 due to a temperature change and a difference in position of the measurement point. A beam tilt angle adjustment amount ΔTilt(i) from a reference angle can be calculated by using a function H (X, Y, W, X0, Y0) using, as an input, each of the wafer temperature W'(i) of the wafer 108, the coordinates (X, Y) of the measurement point, and the coordinates (X0, Y0) of the center of the wafer 108. The calculated optimum beam tilt angle adjustment angle ΔTilt(i) can be reflected, for example, when ABCC is executed in step S602 of FIG. 6.

$$\Delta \mathrm{Tilt}(i)=H((X'(i)-X(i)),(Y'(i)-Y(i)),(W'(i)-W(1)),X0,Y0) \quad \text{[Equation 4]}$$

AI based on a technique such as deep learning or machine learning may be used to calculate an adjustment result of ABCC and a beam tilt angle. Further, the adjustment result of ABCC and the beam tilt angle may store an adjustment result calculated by another method. Additionally, when there are a plurality of correction value tables, the ABCC and the beam tilt angle can also be calculated by arithmetic mean in the same manner as the arithmetic mean of the plurality of adjustment values ΔOBJ described in the third embodiment.

Sixth Embodiment

Next, a charged particle beam apparatus using a scanning electron microscope (SEM) according to a sixth embodiment will be described with reference to FIG. 9. Since the overall configuration and basic operation of the apparatus are the same as those of the first embodiment (FIGS. 1 to 6), redundant description will be omitted and only differences will be described.

The sixth embodiment is different from the above-described embodiments in that a plurality of charged particle beam apparatuses are provided (for example, three apparatuses A to C). The apparatuses A to C are connected to a data station 200 via a network.

The data station 200 controls communication between the apparatuses A to C. For example, in a case where any recipe stored in the apparatus A is moved or copied to the apparatus B, when a correction value table calculated by the apparatus A already exists, the correction value table can also be moved or copied thereto in the same manner as in the case where data of the recipe is moved or copied thereto.

Since the correction value table acquired in the first embodiment is based on wafer warpage and in-plane height distribution bias caused by the semiconductor manufacturing process, the same correction value table can be used as well among the different apparatuses A to C. Further, a correction value table can be managed in the apparatuses A to C from which the correction value table is acquired, but the same can also be managed in the data station 200 and supplied to the apparatuses A to C as appropriate.

Seventh Embodiment

Next, a charged particle beam apparatus using a scanning electron microscope (SEM) according to a seventh embodiment will be described with reference to FIGS. 10 to 16. FIG. 10 is a schematic diagram illustrating the overall configuration of the scanning electron microscope according to the seventh embodiment. In FIG. 10, the same components as in FIG. 1 will be denoted by the same reference numerals as in FIG. 1, so redundant description will be omitted.

In the scanning electron microscope according to the seventh embodiment herein, the imaging device 101 includes an inclination control coil 126 configured to adjust a tilt angle of a primary electron beam emitted from the electron source 102, and an inclination control unit 127 configured to control the inclination control coil 126 is provided in the scanning electron microscope. Further, the storage device 120 has, in a correction value table, correction value data of a beam tilt angle that is different for each semiconductor manufacturing apparatus used to manufacture a semiconductor device using the wafer 108, as will be described later. In the seventh embodiment, such correction value data of the beam tilt angle is provided in addition to or instead of the adjustment value ΔOBJ(i) of the focus position of the primary electron beam as in the first embodiment.

As represented by a three-dimensional NAND flash memory, high integration by three-dimensionalization is progressing in the field of a semiconductor device. In such a three-dimensional device, the need for measuring a pattern shape having a deep hole or a groove with high accuracy is increasing. Therefore, there is a demand for a scanning electron microscope capable of observing the bottom of a hole by tilting the beam in accordance with the formed deep hole or groove. For example, as illustrated in the left diagram of FIG. 11, in a case where an inclined deep hole 601 is formed in the semiconductor device (wafer 108), when a primary electron beam 602 having a substantially vertical tilt angle is used, an SEM image in which a part of the bottom is hidden is obtained, as illustrated in the upper right diagram of FIG. 11. On the other hand, in the case of using a primary electron beam 603 having a tilt angle that is inclined in accordance with the inclination of the deep hole 601, it is possible to obtain a SEM image 605 in which an accurate bottom shape can be measured.

The inclination angle of the deep hole changes depending on the position thereof in the wafer 108. FIG. 12 schematically illustrates a difference in inclination angles of deep holes 611 to 613 respectively formed at different positions in the wafer 108. The deep hole 612 near the center of the wafer 108 has a small inclination angle, and the bottom of the deep hole 612 can be clearly observed even though the incident angle of a primary electron is almost vertical (615). On the other hand, the deep holes 611 and 613 respectively formed in the peripheral edge of the wafer 108 generally have a large inclination angle. Here, when the incident angle of the primary electron is almost vertical, the primary electron is not incident on the entire bottom and a backscattered electron thereof is not emitted to the outside, so that the image of the bottom cannot be clearly observed (614 and 616).

Generally, in a semiconductor factory, as illustrated in FIG. 13, normally, a plurality of manufacturing apparatuses (for example, two apparatuses D and E) are used for the same processing process, and a distribution of inclination of a deep hole formed on the surface of the wafer 108 is different depending on which of the manufacturing apparatuses D and E is used. Therefore, in the seventh embodiment, as illustrated in FIG. 14, in each recipe, adjustment results of beam tilt angles (Tilt_X, Tilt_Y) of primary electrons are stored for each of the different manufacturing apparatuses D and E as a part of the correction value table. In the example of FIG. 14, the tilt angle Tilt_X in the X direction and the tilt angle Tilt_Y in the Y direction are respectively stored as the beam tilt angles, and the form of tilt angle storage is not limited thereto. For example, the tilt amount of a primary electron and the tilt direction thereof can be stored in polar coordinate representation.

Next, a description will be given as to a procedure of correcting a tilt angle of a primary electron beam in the charged particle beam apparatus according to the seventh embodiment with reference to flowcharts in FIGS. 15 and 16. When execution of a recipe is started, it is determined whether correction value data of a tilt angle corresponding to the recipe exists in the storage device 120 (whether the same is stored therein) (step S701). When it is determined that there is no correction value data (No), a tilt angle of a primary electron beam set in the recipe is set, and measurement of the wafer 108 is started (step S702).

On the other hand, in step S701, when it is determined that the correction value data of the tilt angle corresponding to the recipe exists (Yes), it is determined whether a correction value of a manufacturing apparatus used to process the wafer 108 is stored as correction value data (step S703). When the correction value data of the corresponding manufacturing apparatus exists (Yes), the correction value data of the corresponding manufacturing apparatus is read out and used to adjust the tilt angle of the primary electron beam at the time of measuring the wafer 108 (step S704). On the other hand, when it is determined that the correction value data of the corresponding manufacturing apparatus does not exist in the storage device 120 (No), an average value of correction value data of all other manufacturing apparatuses is calculated, and the tilt angle of the primary electron beam is corrected according to the average value (step S705).

Next, details of step S702 will be described with reference to FIG. 16. As described above, when there is no correction value data for a tilt angle of a primary electron beam in the selected recipe, in principle, the tilt angle of the primary electron beam is set according to a set value set in the recipe, and the wafer 108 is measured. Meanwhile, as illustrated in FIG. 16, it is also possible to change a beam tilt angle according to a movement distance between a plurality of measurement points. That is, at a certain measurement point, it is determined whether a movement distance from a previous measurement point is less than a threshold value (step S801). In the case of No, the tilt angle of the primary electron beam is set in principle according to the set value of the recipe (step S802), and in the case of Yes, the tilt amount of the primary electron beam set at the previous measurement point is set (step S803). This is because when a distance between measurement points is sufficiently short, a difference in pattern inclination is considered to be small. Regardless of whether the determination in step S801 is Yes or No, pattern measurement is executed using the set beam tilt angle (step S804), and the measured pattern inclination is stored as a correction value in the correction value table (step S805). When all the measurement points are measured, the recipe is terminated, and when any measurement point to be measured remains, the processing moves to the next measurement point (step S806).

Eighth Embodiment

Next, a charged particle beam apparatus using a scanning electron microscope (SEM) according to an eighth embodiment will be described with reference to FIG. 17. FIG. 10 is a schematic diagram showing the overall configuration of the scanning electron microscope according to the seventh embodiment. In FIG. 10, the same components as in FIG. 1 will be denoted by the same reference numerals as in FIG. 1, so redundant description will be omitted.

In the same manner as in the seventh embodiment, the eighth embodiment is configured to adjust a tilt angle of a primary electron beam according to correction value data. However, in the eighth embodiment, an inclination angle TiltH of a deep hole is determined according to a function (TiltH=A×Tm+B, where A and B are constants) indicating a relationship between an elapsed time Tm from maintenance of a manufacturing apparatus and an inclination angle TiltH of a deep hole formed at the elapsed time Tm, and the tilt angle of the primary electron beam is adjusted according to the determination. A correction value table stores, as correction value data, measurement results of the inclination angle TiltH of the deep hole up to now (TiltH (1) to (N−1)) and the elapsed time Tm from the maintenance at that time. According to this correction value data, the above relational expression is determined using, for example, the least-squares method or the like. When the elapsed time from the maintenance of the manufacturing apparatus reaches T(N), the tilt angle of the primary electron beam is adjusted according to the inclination angle TiltH(N) of the deep hole determined by this relational expression. The relational expression may be a linear expression as described above, or may be another expression.

Ninth Embodiment

Next, a charged particle beam apparatus using a scanning electron microscope (SEM) according to a ninth embodiment will be described with reference to FIGS. 18 to 20. The overall configuration and basic operation of the apparatus may be the same as those of the above-described embodiments, and redundant description thereof will be omitted. The ninth embodiment is different from the above-described embodiments in that a beam tilt angle at the time of recipe execution is corrected using both a correction value table stored for each manufacturing apparatus used to process the wafer 108 and a correction value table for each charged particle beam apparatus. By using the correction value table for each manufacturing apparatus and the correction value table for each charged particle beam apparatus, it is also possible to execute focal height correction and ABCC correction instead of or in addition to correction of the beam tilt angle.

When a deep hole and a deep groove are processed in the wafer 108, as described above, the distribution of the inclination angle of the deep hole in the surface of the wafer 108 may be different for each manufacturing apparatus. Therefore, in the seventh embodiment, in each recipe, the adjustment results of the beam tilt angles (Tilt_X, Tilt_Y) of the primary electrons are stored for each of the different manufacturing apparatuses D and E as a part of the correction value table (refer to FIG. 14). Generally, the influence of the electrostatic chuck 109 on the warpage of the wafer 108 is considered to be smaller than the pattern inclination in the processing of the manufacturing apparatus. However, when highly accurate measurement is required, the influence of the electrostatic chuck 109 cannot be ignored. Therefore, in the ninth embodiment, in addition to the correction value table for each manufacturing apparatus, the correction value table caused by the measurement apparatus (charged particle beam apparatus), as illustrated in FIG. 18, is stored in the storage device 120, and the beam tilt angle is corrected based on two types of correction value tables. As illustrated in FIG. 19, a correction amount of a beam tilt angle (Tilt_x, Tilt_Y) at each measurement point when a recipe is executed is a value obtained by summing up a correction amount (TX-A, TY-A) for each manufacturing apparatus and a correction amount (TX-Z, TY-Z) for each measurement apparatus (charged particle beam apparatus).

A description will be given as to a procedure of correcting a tilt angle of a primary electron beam in the charged particle beam apparatus according to the ninth embodiment with reference to a flowchart in FIG. 20. When execution of a recipe is started, it is confirmed whether a correction value for each charged particle beam apparatus corresponding to the recipe exists in the storage device 120 (step S701). When there is no correction value (No), the tilt angle of the primary electron beam is adjusted to a standard beam tilt angle set in the recipe (step S702).

On the other hand, when it is determined that the correction value for each charged particle beam apparatus corresponding to the recipe exists in the storage device 120 (Yes), in step S703, it is further determined whether a correction value corresponding to a manufacturing apparatus used to process the wafer 108 exists in the storage device 120. When it is determined that such a correction value exists (Yes), the processing proceeds to step S706, and the tilt angle of the primary electron beam is corrected using a value as a correction value, the value being obtained by adding the correction amount for each charged particle beam apparatus to the correction value for each manufacturing apparatus (step S706). On the other hand, when it is determined that the correction value corresponding to the manufacturing apparatus does not exist in the storage device 120, calculation is executed to obtain an average value of correction values of the tilt angles of all manufacturing apparatuses, and a value obtained by adding this average value to the correction value of the tilt angle for each charged particle beam apparatus is used as a correction value (step S707). Then, a correction value table for each manufacturing apparatus stored in the storage device 120 is updated according to a value obtained by subtracting the correction amount for each charged particle beam apparatus from a measured value of the inclination angle of the deep hole of the wafer 108 obtained according to the recipe (step S708).

As described above, according to the ninth embodiment, both the correction value table for each manufacturing apparatus and the correction value table for each charged particle beam apparatus can be used to adjust the tilt angle of the primary electron beam, thereby making it possible to absorb variations for each manufacturing apparatus.

Although various embodiments of the present disclosure have been described above, the present disclosure is not limited to the embodiments, and includes various modifications. For example, the embodiments have been described in detail in order to describe the present disclosure in an easy-to-understand manner, and are not necessarily limited to those having all the configurations described above. Further, a part of the configuration of one embodiment can be replaced with the configuration of another embodiment, and the configuration of another embodiment can be added to the configuration of one embodiment. Additionally, another configuration can be added, deleted, and replaced with respect to a part of the configuration of each embodiment.

REFERENCE SIGNS LIST

101: imaging device
102: electron source
103: converging lens
104: deflection coil

105: objective lens
106, 107: detector
108: wafer
109: electrostatic chuck
110: stage movable unit
111: high voltage power source
112: converging lens control unit
113: image calculation unit
114: deflection coil control unit
115: focal height control unit
116: stage control unit
118: control unit
119: input/output unit
120: storage device
121: light source
122: sensor
123, 124: temperature sensor
125: A/D converter
126: inclination control coil
127: inclination control unit
200: data station
601: deep hole
602: primary electron beam
611, 612, 613: deep hole

The invention claimed is:

1. A charged particle beam apparatus configured to measure a sample by irradiating the sample with a charged particle beam, the charged particle beam apparatus characterized by comprising:

a storage device configured to store a correction value table corresponding to a recipe; and a computer system configured to execute measurement on a plurality of measurement points of the sample according to a measurement order determined in the recipe, wherein the computer system stores, when executing the recipe on a first sample, an adjustment result of one or more imaging conditions in the correction value table at each of a plurality of measurement points of the first sample, and adjusts, when executing the recipe on a second sample different from the first sample, the imaging condition based on the adjustment result of the one or more imaging conditions stored in the correction value table at each of the plurality of measurement points;

wherein the computer system stores, when executing the recipe on the first sample, a correction value of focus of the charged particle beam at the plurality of measurement points in the correction value table, and wherein the computer system adjusts, when executing the recipe on the second sample, the focus of the charged particle beam based on the correction value of the focus stored in the correction value table; and wherein the computer system calculates a first correction term for the correction value of the focus based on an elapsed time from start of execution of the recipe stored in the correction value table, and executes focus adjustment based on the first correction term.

2. A charged particle beam apparatus configured to measure a sample by irradiating the sample with a charged particle beam, the charged particle beam apparatus characterized by comprising:

a storage device configured to store a correction value table corresponding to a recipe; and a computer system configured to execute measurement on a plurality of measurement points of the sample according to a measurement order determined in the recipe, wherein the computer system stores, when executing the recipe on a first sample, an adjustment result of one or more imaging conditions in the correction value table at each of a plurality of measurement points of the first sample, and adjusts, when executing the recipe on a second sample different from the first sample, the imaging condition based on the adjustment result of the one or more imaging conditions stored in the correction value table at each of the plurality of measurement points;

wherein the computer system stores, when executing the recipe on the first sample, a correction value of focus of the charged particle beam at the plurality of measurement points in the correction value table, and wherein the computer system adjusts, when executing the recipe on the second sample, the focus of the charged particle beam based on the correction value of the focus stored in the correction value table; and wherein the computer system calculates a second correction term for the correction value of the focus based on a temperature change from start of execution of the recipe stored in the correction value table, and executes focus adjustment based on the second correction term.

3. The charged particle beam apparatus according to claim 1, wherein the computer system executes, when adjusting the focus of the charged particle beam with respect to the second sample, high-speed autofocus based on the correction value of the focus stored in the correction value table.

4. The charged particle beam apparatus according to claim 3, wherein the computer system is configured to display, on a display unit, a difference in focal height before and after focus adjustment by the high-speed autofocus as an error in the correction value.

5. The charged particle beam apparatus according to claim 4, wherein the computer system updates the correction value table based on the error in the correction value.

6. The charged particle beam apparatus according to claim 1, wherein the computer system stores, when executing the recipe on the first sample, an adjustment result of ABCC at the plurality of measurement points in the correction value table, and adjusts, when executing the recipe on the second sample different from the first sample, the ABCC in the second sample based on the adjustment result of the ABCC stored in the correction value table.

7. The charged particle beam apparatus according to claim 1, wherein the computer system stores, when executing the recipe on the first sample, adjustment results of beam tilt angles at the plurality of measurement points in the correction value table, and adjusts, when executing the recipe on the second sample different from the first sample, the beam tilt angle based on the adjustment results of the beam tilt angles stored in the correction value table.

8. The charged particle beam apparatus according to claim 1, wherein a plurality of the charged particle beam apparatuses are connected via a network, wherein the computer system provides, via the network, a correction value table calculated by a first charged particle beam apparatus among the plurality of charged particle beam apparatuses to a storage device of a second charged particle beam apparatus different from the first charged particle beam apparatus, and wherein the second charged particle beam apparatus adjusts the imaging condition based on a correction value included in the provided correction value table.

9. The charged particle beam apparatus according to claim 8, further comprising a data station connected to the plurality of charged particle beam apparatuses via the network, wherein the data station is configured to store the correction value table calculated by the first charged particle beam apparatus and to provide the correction value table to the second charged particle beam apparatus.

10. The charged particle beam apparatus according to claim 7, wherein the computer system stores the correction value table for each recipe, and adjusts, when executing the recipe, a beam tilt angle of the charged particle beam incident on the sample based on the adjustment results of the beam tilt angles stored in the correction value table of the corresponding recipe.

11. The charged particle beam apparatus according to claim 10, wherein the computer system stores the correction value table for each recipe for each manufacturing apparatus used to process the sample, and adjusts, when executing the recipe, the beam tilt angle based on the adjustment results of the beam tilt angles stored in the correction value table of the corresponding manufacturing apparatus.

12. The charged particle beam apparatus according to claim 11, wherein the computer system stores a correction value table as a function of an elapsed time from maintenance of the manufacturing apparatus, and adjusts the beam tilt angle based on an adjustment result of the beam tilt angle, the adjustment result being obtained by inputting, to the function, the elapsed time from the maintenance when the sample is processed by the manufacturing apparatus.

13. The charged particle beam apparatus according to claim 10, wherein the computer system adjusts, when measuring a plurality of measurement points, the beam tilt angle so that the beam tilt angle at a previous measurement point is set according to a movement distance between the previous measurement point and a current measurement point.

14. The charged particle beam apparatus according to claim 1, wherein the correction value table includes a first correction value table stored for each manufacturing apparatus used to process the sample and a second correction value table stored for each charged particle beam apparatus.

15. A method of measuring a sample, using a charged particle beam device, by irradiating the sample with a charged particle beam, the method comprising:

storing a correction value table corresponding to a recipe; and executing, via a computer system configured to execute measurement on a plurality of measurement points of the sample according to a measurement order determined in the recipe, wherein storing the correction value table stores, when executing the recipe on a first sample, an adjustment result of one or more imaging conditions in the correction value table at each of a plurality of measurement points of the first sample, and adjusts, when executing the recipe on a second sample different from the first sample, the imaging condition based on the adjustment result of the one or more imaging conditions stored in the correction value table at each of the plurality of measurement points;

wherein the computer system stores, when executing the recipe on the first sample, a correction value of focus of the charged particle beam at the plurality of measurement points in the correction value table, and wherein the computer system adjusts, when executing the recipe on the second sample, the focus of the charged particle beam based on the correction value of the focus stored in the correction value table; and wherein the computer system calculates a first correction term for the correction value of the focus based on an elapsed time from start of execution of the recipe stored in the correction value table, and executes focus adjustment based on the first correction term.

* * * * *